(12) United States Patent
Yoshikawa et al.

(10) Patent No.: US 7,598,004 B2
(45) Date of Patent: Oct. 6, 2009

(54) FILM-DEPOSITING TARGET AND PREPARATION OF PHASE SHIFT MASK BLANK

(75) Inventors: Hiroki Yoshikawa, Joetsu (JP); Toshinobu Ishihara, Joetsu (JP); Satoshi Okazaki, Joetsu (JP); Yukio Inazuki, Joetsu (JP); Tadashi Saga, Tokyo (JP); Kimihiro Okada, Tokyo (JP); Masahide Iwakata, Tokyo (JP); Takashi Haraguchi, Tokyo (JP); Yuichi Fukushima, Tokyo (JP)

(73) Assignees: Shin-Etsu Chemical Co., Ltd., Tokyo (JP); Toppan Printing Co., Ltd., Tokyo (JP)

( * ) Notice: Subject to any disclaimer, the term of this patent is extended or adjusted under 35 U.S.C. 154(b) by 490 days.

(21) Appl. No.: 11/093,297

(22) Filed: Mar. 30, 2005

(65) Prior Publication Data

US 2005/0217988 A1 Oct. 6, 2005

(30) Foreign Application Priority Data

Mar. 31, 2004 (JP) ............................. 2004-102288

(51) Int. Cl.
*G03F 1/00* (2006.01)
*C25B 11/00* (2006.01)

(52) U.S. Cl. ..................... 430/5; 204/298.13
(58) Field of Classification Search ............ 430/5, 430/394; 428/430; 204/298.13
See application file for complete search history.

(56) References Cited

U.S. PATENT DOCUMENTS

| 6,335,124 | B1 | 1/2002 | Mitsui et al. |
| 2002/0058186 | A1 | 5/2002 | Nozawa et al. |
| 2004/0058254 | A1 | 3/2004 | Nozawa et al. |
| 2004/0072016 | A1* | 4/2004 | Okazaki et al. ............. 428/689 |

FOREIGN PATENT DOCUMENTS

| EP | 0 436 741 A1 | 7/1991 |
| EP | 0 838 726 A1 | 4/1998 |
| JP | 7-140635 A | 6/1995 |
| JP | 2002-014458 A | 1/2002 |
| JP | 2002-162726 | 6/2002 |
| JP | 2003-315977 | 6/2003 |
| WO | WO-97/44709 A1 | 11/1997 |

OTHER PUBLICATIONS

English Translation of the Japanese Office Action, mailed Nov. 12, 2008.

* cited by examiner

*Primary Examiner*—Stephen Rosasco
(74) *Attorney, Agent, or Firm*—Birch, Stewart, Kolasch & Birch, LLP

(57) ABSTRACT

For the manufacture of a halftone phase shift mask blank comprising a transparent substrate and a translucent film of one or more layers having a controlled phase and transmittance, at least one layer of the translucent film comprising Si, Mo and Zr at the same time, a target comprising at least Zr and Mo in a molar ratio Zr/Mo between 0.05 and 5 is useful.

5 Claims, 7 Drawing Sheets

FILM-DEPOSITING TARGET AND PREPARATION OF PHASE SHIFT MASK BLANK

CROSS-REFERENCE TO RELATED APPLICATION

This non-provisional application claims priority under 35 U.S.C. §119(a) on Patent Application No. 2004-102288 filed in Japan on Mar. 31, 2004, the entire contents of which are hereby incorporated by reference.

TECHNICAL FIELD

This invention relates to a phase shift mask blank and phase shift mask for use in the fabrication of semiconductor integrated circuits or the like. More particularly, it relates to a film-depositing target for use in the manufacture of a phase shift mask blank and a method for preparing a phase shift mask blank.

BACKGROUND ART

Photomasks are used in a wide variety of applications including the fabrication of semiconductor integrated circuits such as ICs, LSIs and VLSIs. Basically, the photomask is prepared from a photomask blank having a chromium based light-shielding film on a transparent substrate, by forming a predetermined pattern in the light-shielding film by photolithography using UV or electron beams. The current demand for a higher level of integration in the semiconductor integrated circuit market has created a need for a smaller pattern rule. The traditional solution is by reducing the wavelength of exposure light.

However, reducing the wavelength of exposure light improves resolution at the sacrifice of focal depth. This lowers the process stability and adversely affects the manufacture yield of products. One effective pattern transfer method for solving the problem is a phase shift method. A phase shift mask is used as a mask for transferring a micro-pattern.

Referring to FIGS. 9A and 9B, a phase shift mask, specifically a halftone phase shift mask is illustrated as comprising a substrate 1 and a phase shifter film 2 deposited thereon. The mask consists of a phase shifter 2a that forms a pattern on the substrate and an uncovered area 1a of the substrate 1 that is exposed where the phase shifter 2a is absent. A phase difference of about 180° is set between light transmitted by the uncovered substrate area 1a and light transmitted by the phase shifter 2a. Due to light interference at the pattern boundary, the light intensity at the interfering boundary becomes zero, improving the contrast of a transferred image. The phase shift method permits to increase the focal depth for acquiring the desired resolution. This achieves improvements in resolution and exposure process margin, as compared with conventional masks having ordinary light-shielding patterns in the form of chromium film.

Depending on the light transmission of phase shifter, the phase shift masks are generally divided for practical application into full transmission type phase shift masks and halftone type phase shift masks. The full transmission type phase shift masks are transparent to the exposure light wavelength because the light transmittance of the phase shifter section is equal to the light transmittance of uncovered substrate areas. In the halftone type phase shift masks, the light transmittance of the phase shifter section is several percents to several tens of percents of the light transmittance of uncovered substrate areas.

FIGS. 10 and 11 illustrate the basic structure of a halftone type phase shift mask blank and a halftone type phase shift mask, respectively. The halftone type phase shift mask blank depicted at 50 in FIG. 10 has a halftone phase shift film 2 formed over substantially the entire surface of a transparent substrate 1. Patterning the phase shift film 2 results in the halftone type phase shift mask which is depicted at 60 in FIG. 11 as comprising phase shifter sections 2a forming the pattern on the substrate 1 and uncovered areas 1a of the substrate where the phase shifter is absent. Light that passes the phase shifter section 2a is phase shifted relative to light that passes the uncovered substrate area 1a. The transmittance of the phase shifter section 2a is set to a light intensity that is insensitive to the resist on a wafer or article subject to pattern transfer. Accordingly, the phase shifter section 2a has a light-shielding function of substantially shielding exposure light.

The halftone phase shift masks include single-layer halftone phase shift masks featuring a simple structure and ease of manufacture. Some single-layer halftone phase shift masks known in the art have a phase shifter of MoSi base materials such as MoSiON as described in JP-A 7-140635.

As mentioned above, the halftone phase shift mask is an effective means for accomplishing a high resolution in a simple manner. For accomplishing a higher resolution, there exists a requirement to reduce the exposure wavelength from the current mainstream wavelength of 248 nm (KrF laser) to a shorter wavelength of 193 nm (ArF laser) or less. In order for a halftone phase shift mask to accommodate light exposure at such shorter wavelength, one common approach is to reduce the compositional ratio of metal (e.g., Mo) to silicon of which the halftone phase shift film is made.

However, to accommodate a further shorter wavelength of 157 nm ($F_2$ laser), the MoSiON halftone phase shift film must be sufficiently oxygen rich to provide an acceptable transmittance. Even in cases not intended for the shorter wavelength region, MoSiON films with low oxygen contents have an extremely increased transmittance in a wavelength region longer than the exposure wavelength, which leads to a loss of inspection precision during the defect inspection using longer wavelength light.

This necessitates to increase the oxygen concentration in MoSiON film, but a problem emerges that the film loses chemical resistance.

One candidate that can overcome the chemical resistance problem of MoSiON film is a ZrSiON film which is arrived at by replacing Mo by Zr. Due to its chemical stability, the replacement film, when subjected to dry etching in the mask manufacturing process, exhibits a low dry etching rate, failing to provide a sufficient selectivity relative to glass substrate to achieve precision patterning.

SUMMARY OF THE INVENTION

An object of the present invention is to provide a method for the manufacture of a halftone phase shift mask blank which can be adapted to exposure light of shorter wavelength and has improved chemical resistance. Another object is to provide a film-depositing target for use in the manufacture of such a mask blank.

The present invention pertains to a halftone phase shift mask blank comprising a transparent substrate and a translucent film of one or more layers thereon having a controlled phase and transmittance, at least one layer of the translucent film comprising silicon, molybdenum and zirconium at the same time as constituent elements. The inventors have discovered that a halftone phase shift mask blank which can be adapted to exposure light of shorter wavelength and has improved chemical resistance is manufactured when the layer is deposited using a target comprising zirconium and molybdenum in a specific molar ratio. More specifically, when a target comprising at least two elements, zirconium and molybdenum in a molar ratio Zr/Mo between 0.05 and 5 is used to deposit one layer of the translucent film, a halftone phase shift mask blank is manufactured which can accommodate exposure light of shorter wavelength and is improved in chemical resistance.

For use in the manufacture of a halftone phase shift mask blank comprising a transparent substrate and a translucent film of one or more layers having a controlled phase and transmittance, at least one layer of the translucent film comprising silicon, molybdenum and zirconium at the same time as constituent elements, one aspect of the invention provides a film-depositing target comprising at least two elements, zirconium and molybdenum in a molar ratio Zr/Mo between 0.05 and 5.

The invention in another embodiment provides a film-depositing target comprising at least three elements, silicon, molybdenum and zirconium, with zirconium and molybdenum being present in a molar ratio Zr/Mo between 0.05 and 5. Preferably, the target comprises 80 to 97 mole % of silicon.

Another aspect of the invention provides a method for the manufacture of a halftone phase shift mask blank comprising a transparent substrate and a translucent film of one or more layers having a controlled phase and transmittance, at least one layer of the translucent film comprising silicon, molybdenum and zirconium at the same time as constituent elements.

The method of a first embodiment involves the steps of disposing the target defined above and a silicon-base target in a common chamber, and inducing electric discharges to both the targets at the same time for sputtering, for thereby depositing the at least one layer of the translucent film.

The method of a second embodiment involves the steps of disposing a target comprising 80 to 99 mole % of silicon and zirconium and a molybdenum-base target in a common chamber, and inducing electric discharges to both the targets at the same time for sputtering, for thereby depositing the at least one layer of the translucent film.

The method of a third embodiment involves the steps of disposing a target comprising 80 to 98 mole % of silicon and molybdenum and a zirconium-base target in a common chamber, and inducing electric discharges to both the targets at the same time for sputtering, for thereby depositing the at least one layer of the translucent film.

The invention has an advantage of facilitating the manufacture of a halftone phase shift mask or mask blank which can be adapted to exposure light of shorter wavelength and which offers good chemical resistance and a high precision of patterning.

BRIEF DESCRIPTION OF THE DRAWINGS

The above and other features and advantages of the invention will be more fully understood by reading the following description, taken in conjunction with the accompanying drawings.

FIG. 7 illustrates in sectional view the method of manufacturing a phase shift mask.

FIG. 9B is an enlarged view of region X in FIG. 9A.

DESCRIPTION OF THE PREFERRED EMBODIMENT

Figure 1:
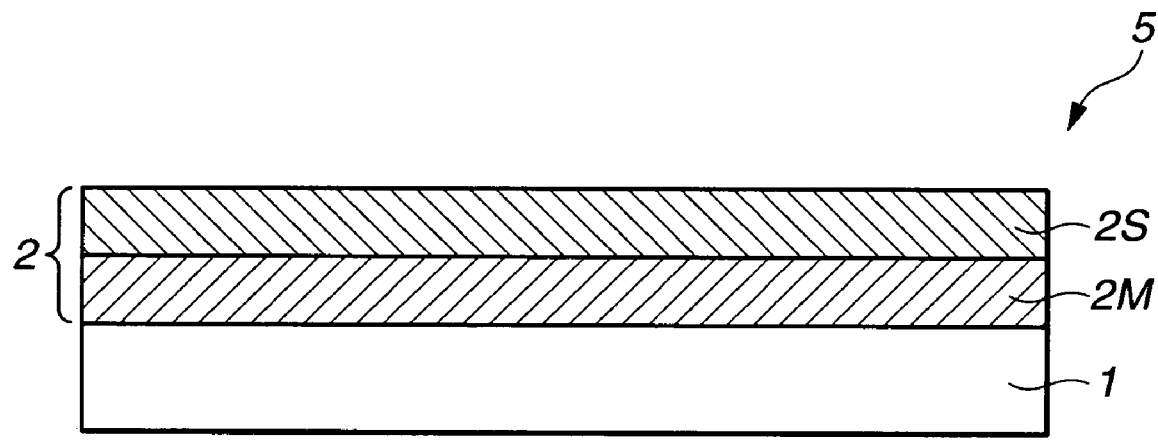
FIG. 1 is a sectional view of a phase shift mask blank in one embodiment of the invention.

In conjunction with the manufacture of a halftone phase shift mask blank comprising a transparent substrate and a translucent film of one or more layers thereon having a controlled phase (or phase difference) and transmittance, at least one layer of the translucent film comprising three elements, silicon (Si), molybdenum (Mo) and zirconium (Zr) at the same time as constituent elements, one embodiment of the invention is a film-depositing target comprising at least two elements, zirconium and molybdenum. Zirconium and molybdenum are present in the target in a molar ratio of Zr/Mo between 0.05 and 5, preferably between 0.1 and 3, and more preferably between 0.1 and 1.

A choice of molar ratio Zr/Mo in the range ensures and facilitates the manufacture of a halftone phase shift mask or mask blank which can be adapted to exposure light of shorter wavelength and which offers good chemical resistance. If the molar ratio of Zr/Mo is less than 0.05, chemical resistance is lost. A molar ratio Zr/Mo in excess of 5 leads to a lower dry etching rate and a vague selectivity relative to the transparent substrate during the etching, failing to provide a precision of patterning.

In another embodiment, the film-depositing target comprises at least three elements, silicon, molybdenum and zirconium. Zirconium and molybdenum are present in the target in a molar ratio Zr/Mo between 0.05 and 5. Disposition of this target solely in a depositing chamber ensures that a halftone phase shift mask blank containing silicon, molybdenum and zirconium at the same time is manufactured.

In a preferred embodiment, the silicon content of the film-depositing target is 80 to 97 mole %. This film-depositing target is best suited for the manufacture of a halftone phase shift mask blank which is compatible with exposure light having a wavelength of 193 nm (ArF laser) or 157 nm ($F_2$ laser).

If desired, the target comprising at least two elements: Mo and Zr, or comprising at least three elements: Si, Mo and Zr, both with a molar ratio of Zr/Mo ranging from 0.05 to 5, is combined with another target comprising a major proportion of silicon so that they may be co-sputtered. The combination permits the silicon content of a film being deposited to be adjusted to any desired level, enabling to form a halftone phase shift film intended for a desired exposure wavelength.

In another embodiment, a first film-depositing target comprising 80 to 99 mole % of silicon and zirconium and a second film-depositing target comprising a major proportion of molybdenum are disposed in a common chamber and co-sputtered. A similar halftone phase shift film is then produced. In this embodiment, the preferred first target has a Zr content of 1 to 20 mole % and optionally contains up to 1 mole % of Hf and/or Mo. The preferred second target contains 80 to 100 mole %, especially 95 to 100 mole % of Mo. In case Mo is less than 100 mole %, the balance is preferably Si or metals such as Zr and Hf.

In the other embodiment, the sputtering power applied to the second target is extremely lower than to the first target. It is then desirable to use a sputtering system having an ability to produce controlled electric discharges.

In a further embodiment, a third film-depositing target comprising 80 to 98 mole % of silicon and molybdenum and a fourth film-depositing target comprising a major proportion of zirconium are disposed in a common chamber and co-sputtered. A similar halftone phase shift film is then produced. In this embodiment, the preferred third target has a Mo content of 2 to 20 mole % and optionally contains up to 1 mole % of Hf and/or Zr. The preferred fourth target contains 80 to 100 mole %, especially 95 to 100 mole % of Zr. In case Zr is less than 100 mole %, the balance is preferably Si or metals such as Mo and Hf. Likewise, it is desirable to use a sputtering system having an ability to produce controlled electric discharges.

Using the film-depositing target of the invention optionally in combination with another target, a halftone phase shift mask blank is manufactured by the method of the invention. The halftone phase shift mask blank is described in detail.

Referring to FIG. 1, a halftone phase shift mask blank 5 is illustrated as comprising a substrate 1 of quartz, $CaF_2$ or the like by which exposure light is transmitted, and a halftone phase shift film 2 of one or more layers formed thereon. At least one layer of the halftone phase shift film 2 contains a metal (M) and silicon in a molar ratio (M/Si) of up to 0.1, preferably from 0.01 to 0.08, and more preferably from 0.01 to 0.05. This layer is desirably a light absorption function film composed of an unsaturated metal compound to be described later.

Figure 2:
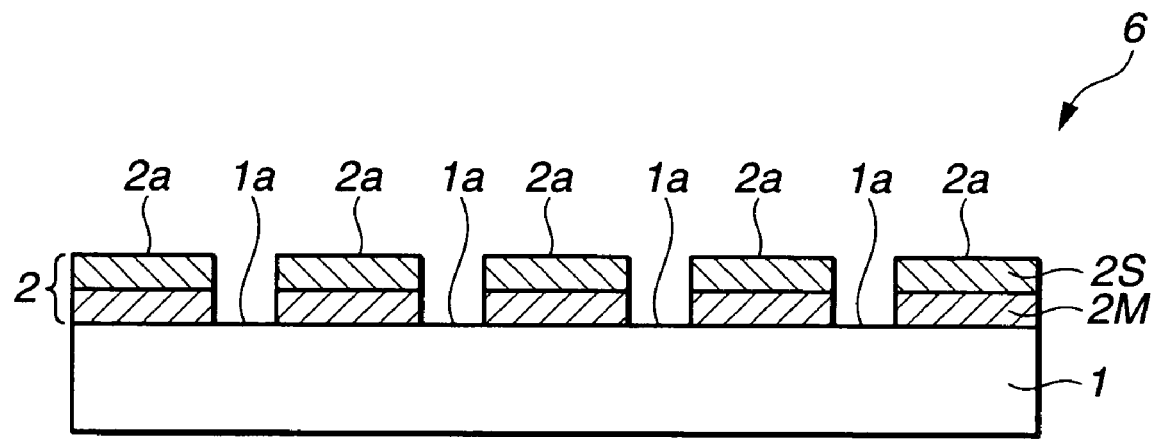
FIG. 2 is a sectional view of one exemplary phase shift mask.

FIG. 2 shows a halftone phase shift mask 6 which is obtained by patterning the phase shift film 2 of the mask blank 5 shown in FIG. 1. The patterned film 2 includes phase shifter sections 2a forming the pattern on the substrate 1 and uncovered areas 1a of the substrate where the phase shifter is absent.

In a preferred embodiment of the invention, the halftone phase shift mask blank 5 shown in FIG. 1 includes the halftone phase shift film 2 which consists of two layers: a metal or unsaturated metal compound film 2M having a light absorbing function (referred to as "light absorption function film") and a film 2S having a phase shift function and a weak light absorbing function (referred to as "phase shift function film").

The light absorption function film 2M is a film formed of an oxide, nitride, carbide, oxynitride, oxynitride carbide or nitride carbide comprising a metal or a metal and silicon. More preferred is an unsaturated metal compound film that is a film of metal-rich composition wherein the contents of oxygen, nitrogen and carbon are less than the stoichiometry. A film consisting essentially of a metal or a metal and silicon is also acceptable.

The metal of which the light absorption function film 2M is constructed may be any element selected from transition metals, lanthanoids, silicon and combinations thereof. Of these, preferred are Mo, Zr, Ta, Cr and Hf alone or compounds thereof such as oxides, nitrides, carbides, oxynitrides, oxynitride carbides or nitride carbides, which optionally contain silicon. The content of silicon, if present, may be 70 to 99 mole %.

Typically the light absorption function film 2M has a thickness of 1.25 to 20 nm.

The phase shift function film 2S is desirably a film formed of a nitride, oxide or oxynitride comprising a metal and silicon. This compound film prefers that no metal bonds be left. It is desirably used in the form of a saturated compound film. Then, a halftone phase shift film having chemical resistance is obtained.

As used herein, the "stoichiometry" refers to a compound in which constituent elements assume typical valence numbers so as to provide an exact balance of electric charges. The metal compound having elements in such a constitution ratio is referred to as "saturated metal compound." Of exemplary metals, Mo is hexa-valent (6+), Zr is tetra-valent (4+), Ta is penta-valent (5+), Cr is tri-valent (3+), Hf is tetra-valent (4+), and silicon (Si) is tetra-valent (4+). Of light elements, oxygen (O) is di-valent (2−), nitrogen (N) is tri-valent (3−), and carbon (C) is tetra-valent (4−). Specifically, in the case of an oxide containing molybdenum and silicon in a ratio of 1:2, the stoichiometric composition is $MoSi_2O_7$; and in the case of a nitride containing molybdenum and silicon in a ratio of 1:1, the stoichiometric composition is $MoSiN_{10/3}$.

By contrast, a metal compound in which the contents of light elements, i.e., oxygen, nitrogen and carbon are lower than the stoichiometry so that the apparent electric charge balance determined by the valence numbers is thrown off is referred to as "unsaturated metal compound." Specifically, in the case of oxides containing molybdenum and silicon in a ratio of 1:2, those compounds having the average composition: $MoSi_2O_{7-a}$ wherein a is a positive number of $0<a<7$ are unsaturated metal compounds; and in the case of nitrides containing molybdenum and silicon in a ratio of 1:1, those compounds having the average composition: $MoSiN_{(10/3)-b}$ wherein b is a positive number of $0<b<10/3$ are unsaturated metal compounds.

Although the reduced content of light element tips the apparent electric charge balance as mentioned above, a balance of electric charges is actually kept by virtue of generation of positive electric charges like holes and a change of metal valence number (e.g., the valence number of Mo changes from hexa-valence (6+) to tri-valence (3+)).

The phase shift function film 2S should preferably satisfy that the content ratio of metal to silicon be up to 0.1, more preferably 0.01 to 0.08, even more preferably 0.01 to 0.05, on a molar basis. Then, the phase shift film can provide a desired transmittance of 4% to 35% and a desired phase difference of 170° to 185° even when used with short wavelength light equal to or less than 193 nm.

As to the composition of the phase shift function film 2S, preferably the metal silicide oxides (MSiO wherein M is metal) consist essentially of 0.1 to 7 at % of M, 10 to 42 at % of Si and 30 to 60 at % of O; and the metal silicide oxynitrides (MSiON wherein M is metal) consist essentially of 0.1 to 7 at % of M, 10 to 57 at % of Si, 2 to 20 at % of O and 5 to 57 at % of N. The metal M used herein is selected from transition metals such as Mo, Zr, Ta, Cr, and Hf. Of these, Mo and Zr are preferred for an overall profile of properties including chemical resistance and optical properties.

Typically the phase shift function film 2S has a thickness of 40 to 100 nm, preferably 50 to 90 nm.

Figure 3A:
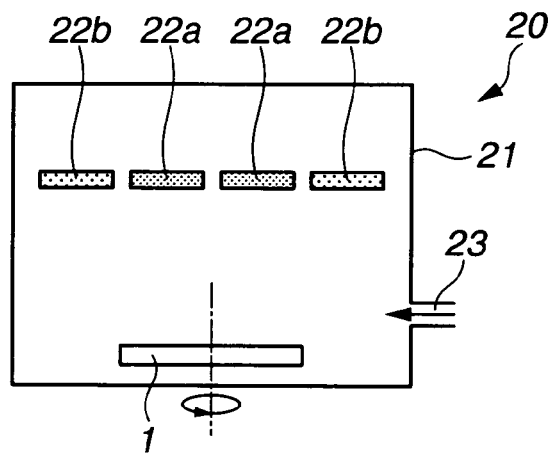
FIG. 3 illustrates an exemplary system for manufacturing a phase shift mask blank.
Figure 3B:
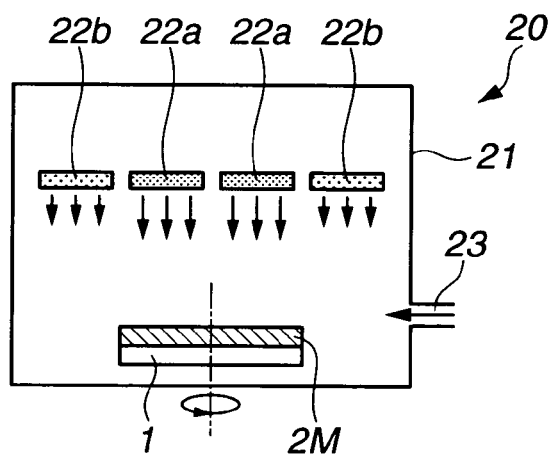
Figure 3C:
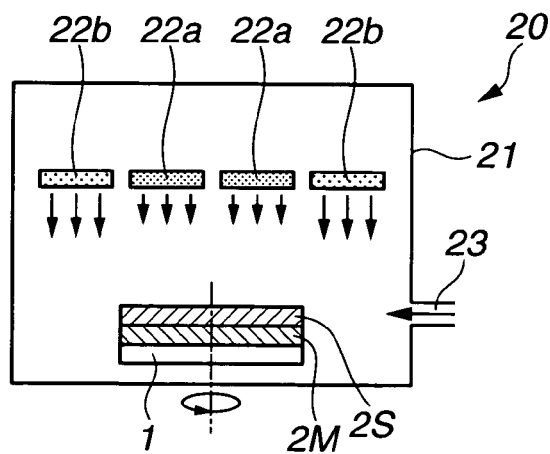

The halftone phase shift mask blank having the light absorption function film 2M and phase shift function film 2S formed thereon may be prepared using a system as shown in FIG. 3. As shown in FIG. 3a, a film-depositing target 22a (e.g., target composed of metal and silicon) and another film-depositing target 22b (e.g., silicon target) are disposed in a chamber 21. A substrate 1 is disposed in the chamber 21 and opposed to the targets. Argon gas and optionally a reactive gas are fed into the chamber 21 through a gas inlet 23. Electric discharge powers are applied to the targets 22a, 22b to effect sputtering, depositing a light absorption function film 2M on the substrate as shown in FIG. 3b. Then the electric discharge powers to the targets are altered to effect sputtering again, forming a phase shift function film 2S as shown in FIG. 3c. However, the invention is not limited to this embodiment.

While the halftone phase shift film is composed of two layers in the above embodiment, it may be composed of a single layer. In this case, the metal content of a film corresponding to the phase shift function film 2S is tailored so as to provide a desired transmittance of 4 to 35% and a desired phase difference of 170 to 185 deg.

Figure 4:
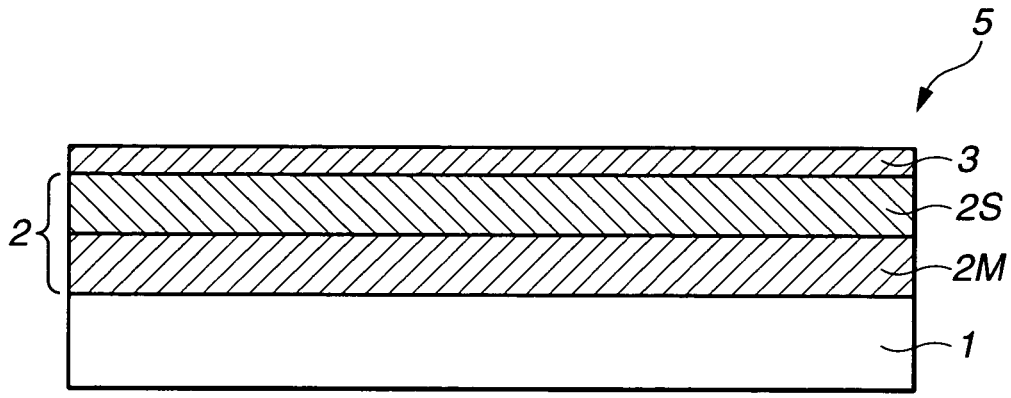
FIG. 4 is a sectional view of an exemplary phase shift mask blank having a chromium-based light-shielding film.
Figure 5:
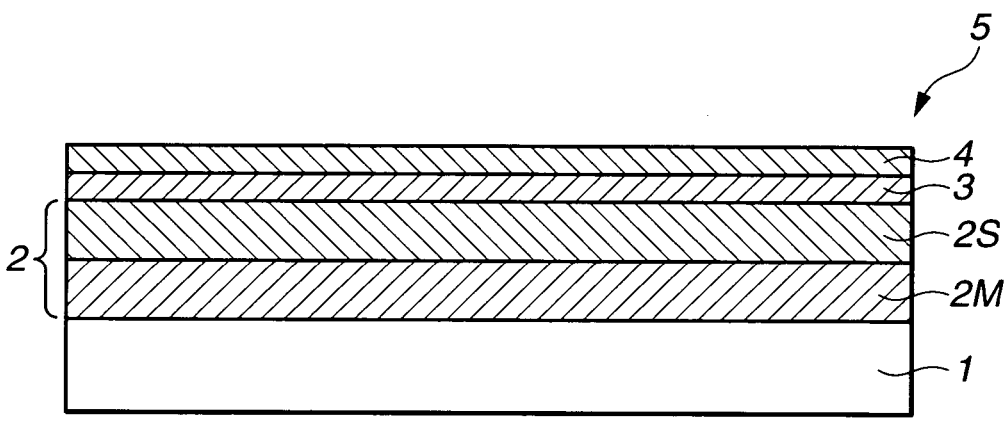
FIG. 5 is a sectional view of an exemplary phase shift mask blank having a chromium-based light-shielding film and a chromium-based antireflection film.
Figure 6:
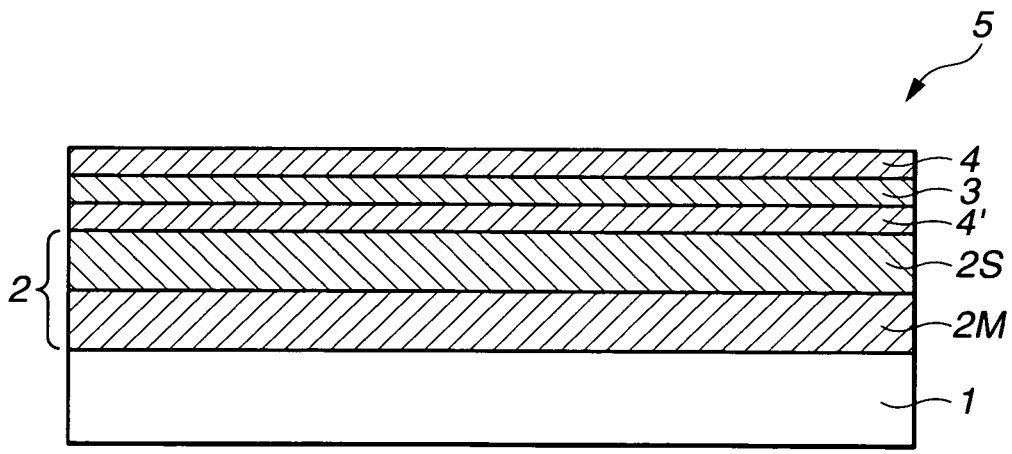
FIG. 6 is a sectional view of a further exemplary phase shift mask blank.
Figure 7A:
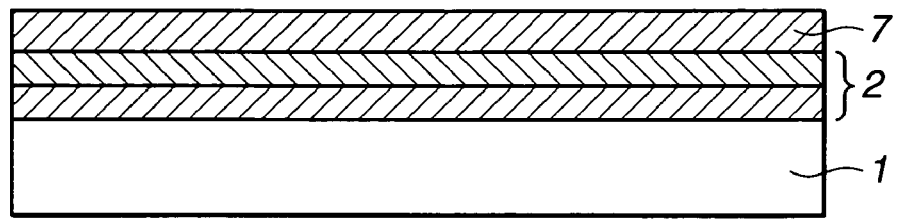
FIG. 7A shows the mask blank on which a resist film has been formed.
Figure 7B:
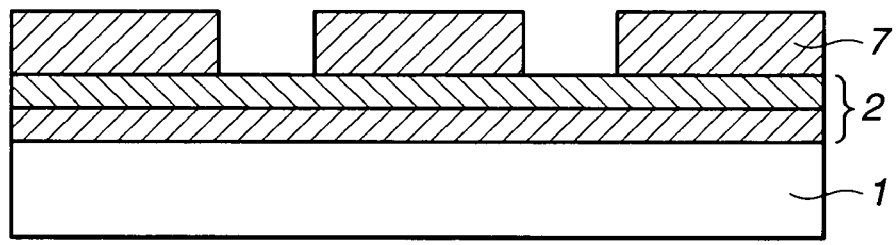
FIG. 7B shows the structure after the resist film has been patterned.
Figure 7C:
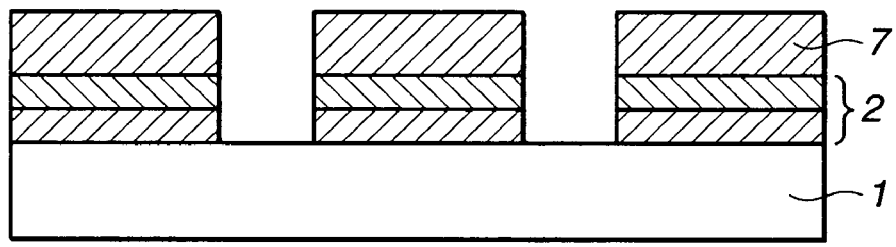
FIG. 7C shows the structure after etching.
Figure 7D:
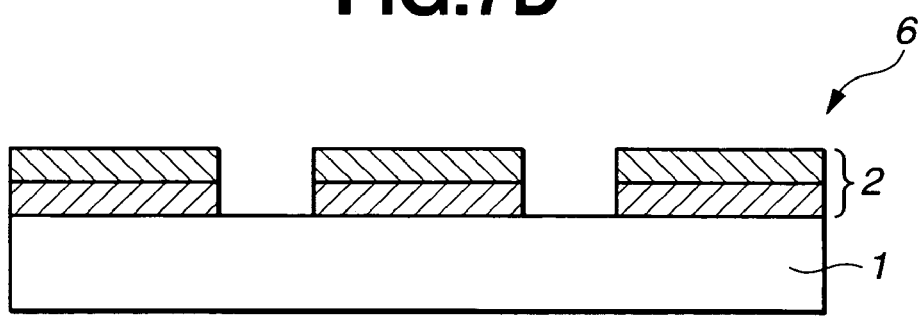
FIG. 7D shows the structure after the resist film has been removed.

In preferred embodiments of the invention, a chromium based light-shielding film or a chromium based antireflective film or both are formed on the halftone phase shift film. In one preferred embodiment, as shown in FIG. 4, the phase shift mask blank further includes a chromium-based light-shielding film 3 on the halftone phase shift film 2. In a further preferred embodiment, as shown in FIG. 5, the phase shift mask blank further includes a chromium-based antireflection film 4 formed on the chromium-based light-shielding film 3 for reducing reflection from the light-shielding film 3. In a still further preferred embodiment, as shown in FIG. 6, the phase shift mask blank includes a halftone phase shift film 2, a first chromium-based antireflection film 4', a chromium-based light-shielding film 3, and a second chromium-based antireflection film 4 formed on a transparent substrate 1 in the described order.

The chromium-based light-shielding film or chromium-based antireflection film is preferably made of chromium oxycarbide (CrOC), chromium oxynitride (CrON), chromium oxynitride carbide (CrONC) or a multilayer combination thereof.

The chromium-based light-shielding film or chromium-based antireflection film can be formed by reactive sputtering. Specifically, the target is neat chromium or chromium having added thereto oxygen, nitrogen, carbon or a combination thereof. The sputtering gas is an inert gas such as argon or krypton to which carbon dioxide, $CH_4$ or CO gas is added as a carbon source.

For example, sputtering gases which may be used to form a CrONC film include a gas mixture composed of at least one each of a carbon-containing gas (e.g., $CH_4$, $CO_2$, CO), a nitrogen-containing gas (e.g., NO, $NO_2$, $N_2$) and an oxygen-containing gas (e.g., $CO_2$, NO, $O_2$ ), or any such gas mixture in combination with an inert gas such as argon, neon or krypton. Using $CO_2$ gas or CO gas as both the carbon and oxygen sources is especially advantageous for uniformity in the plane of the substrate and for controllability during production. Each of the sputtering gases may be separately fed into the sputtering chamber, or some or all of the gases may first be mixed together then fed into the chamber.

Preferably the CrOC film consists essentially of 20 to 95 at %, especially 30 to 85 at % of Cr, 1 to 30 at %, especially 5 to 20 at % of C, and 1 to 60 at %, especially 5 to 50 at % of O; and the CrONC film consists essentially of 20 to 95 at %, especially 30 to 80 at % of Cr, 1 to 20 at %, especially 2 to 15 at % of C, 1 to 60 at %, especially 5 to 50 at % of O, and 1 to 30 at %, especially 3 to 20 at % of N.

The light shielding film and the antireflective film each may have a thickness which is commonly employed in conventional phase shift mask blanks. Typically light shielding film has a thickness of 20 to 100 nm, preferably 30 to 60 nm and the antireflective film has a thickness of 5 to 40 nm, preferably 10 to 30 nm.

The phase shift mask is manufactured by patterning the phase shift film on the phase shift mask blank of the invention as produced above. More specifically, by patterning the phase shift film 2 on the phase shift mask blank shown in FIG. 1, a phase shift mask as shown in FIG. 2 is manufactured.

The phase shift mask 6 of the structure shown in FIG. 2 may be manufactured by a process as shown in FIG. 7. After a halftone phase shift film 2 is formed on a substrate 1 by the process described above, a resist film 7 is formed on the film 2 (FIG. 7A). The resist film 7 is lithographically patterned (FIG. 7B), after which the phase shift film 2 is etched (FIG. 7C), and the resist film 7 is subsequently stripped (FIG. 7D). In this process, application of the resist film, patterning (exposure and development), etching, and removal of the resist film may be carried out by known methods.

Figure 8:
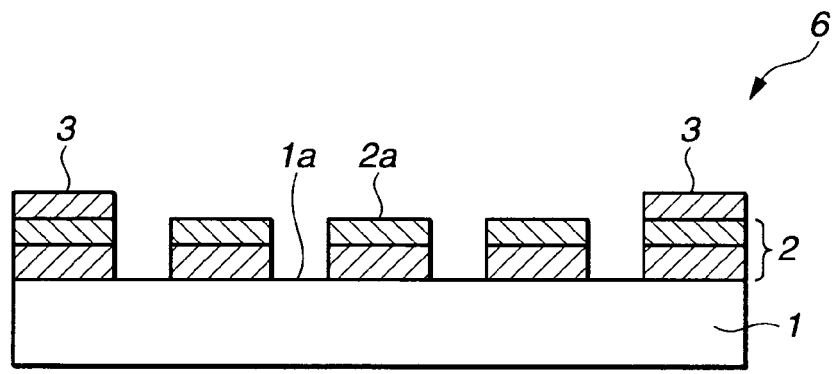
FIG. 8 is a sectional view of another exemplary phase shift mask.
Figures 9A, 9B:
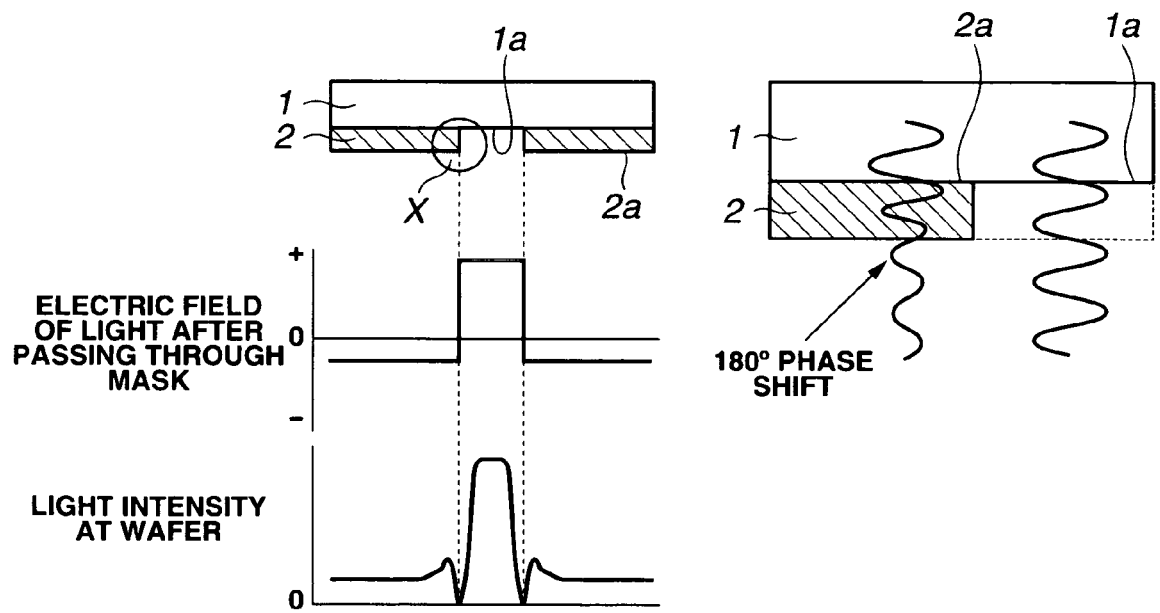
FIGS. 9A and 9B illustrate the operating principle of a halftone phase shift mask.

In cases where a Cr-based film (e.g., chromium-based light-shielding film and/or chromium-based antireflection film) is formed on the halftone phase shift film, a phase shift mask 6 on which the Cr-based film (chromium-based light-shielding film 3) remains at the peripheral edges of the substrate 1 (see FIG. 8) can be produced by etching away the Cr-based film 3 in the regions that are to be subject to light exposure, thereby leaving the surface of the phase shift film 2 exposed, then patterning the phase shift film 2 into sections 2a as described above. Alternatively, a phase shift mask can be produced by applying a resist to the Cr-based film 3 and patterning the resist, then etching the Cr-based film 3 and the phase shift film 2 for patterning. Only the regions of the Cr-based film 3 that are to be subject to light exposure are then removed by selective etching so as to leave the phase shift pattern exposed at the surface. It is noted in FIGS. 1 to 8 that the halftone phase shift film 2 consists of a light absorption function film 2M and a phase shift function film 2S although the invention is not limited to the two-layer structure.

EXAMPLE

Examples and Comparative Examples are given below for illustrating the invention although the invention is not limited thereto.

Example 1

Figure 10:
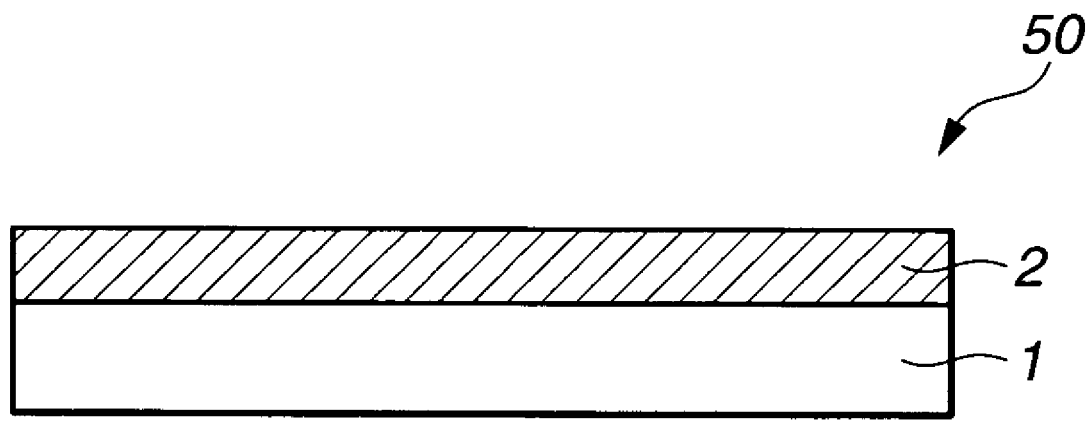
FIG. 10 is a sectional view of a phase shift mask blank.
Figure 11:
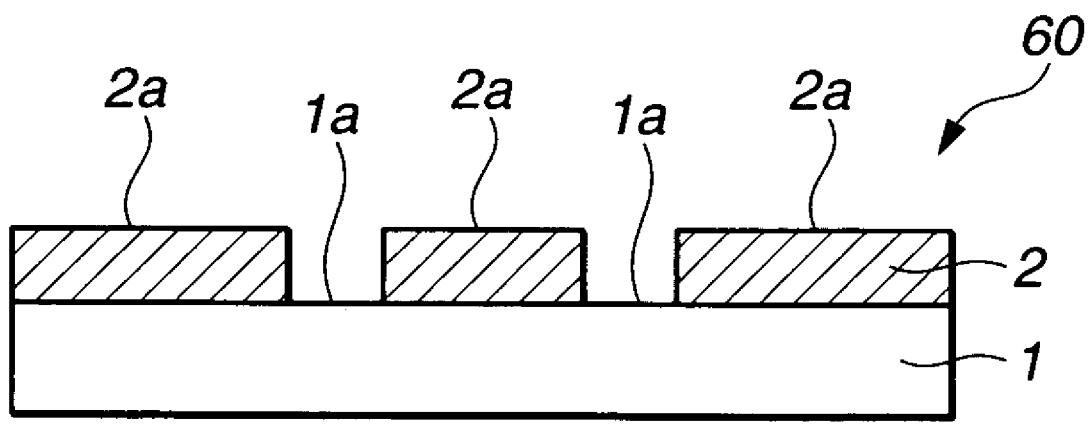
FIG. 11 is a sectional view of a phase shift mask made from the blank of FIG. 10.

A halftone phase shift mask blank of the structure shown in FIG. 10 was prepared.

Figure 12:
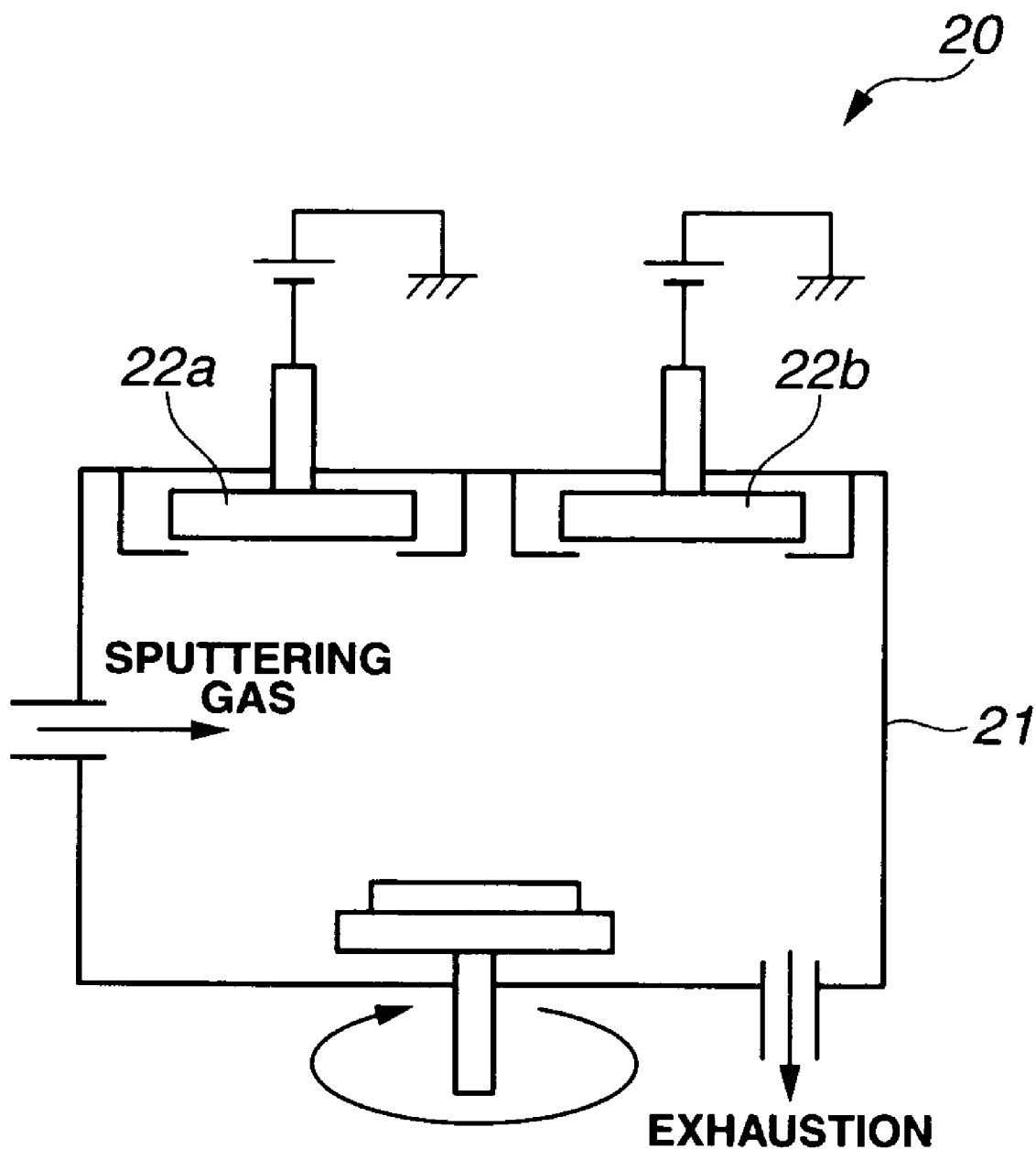
FIG. 12 schematically illustrates a DC sputtering system used in Examples.

For the deposition of a halftone phase shift film, a DC sputtering system including two targets as shown in FIG. 12 was used. The sputtering targets used were a sintered $Mo_5Zr$ target and a single crystal silicon target.

Film deposition was performed by feeding Ar at a flow rate of 5 $cm^3$/min, $N_2$ at a flow rate of 70 $cm^3$/min and $O_2$ at a certain flow rate together as the sputtering gas into the chamber. During the gas feed, a gas pressure of 0.10 Pa was set in the sputtering chamber. By applying a sputtering power of 50 W across the $Mo_5Zr$ target and a sputtering power of 950 W across the Si target for co-sputtering and rotating a substrate at 30 rpm, a halftone phase shift film was deposited on the substrate.

It is noted that the flow rate ($cm^3$/min) of gas is standardized at 0° C. and 1013 hPa (one atmosphere).

The halftone phase shift film deposited under the above conditions was measured for phase difference. Based on the measured value, the film thickness and the flow rate of $O_2$ were adjusted so as to provide a phase difference of 180° and a transmittance of 6% at a wavelength of 157 nm ($F_2$ laser).

The halftone phase shift film thus obtained was examined for chemical resistance and dry etching behavior.

Chemical Resistance

The film was treated with a liquid mixture of aqueous ammonia, aqueous hydrogen peroxide and water in a ratio of 1:1:8 at 23° C. for one hour, after which its phase difference was measured again. A change of phase difference was determined to be 1.2°. That is, chemical resistance is expressed by a phase difference change (deg).

Dry Etching

While the film was dry etched with $CF_4$, a just etching time was determined. The film gave a just etching time of 372 seconds.

Examples 2 to 7

Halftone phase shift films were deposited as in Example 1 aside from using different targets. The depositing conditions differing from Example 1 were target composition, sputtering powers and $O_2$ flow rate. The halftone phase shift films thus obtained were examined for chemical resistance and dry etching behavior. The depositing conditions and test results are summarized in Table 1.

Comparative Examples 1 to 3

Halftone phase shift films were deposited as in Example 1 aside from using different targets. The depositing conditions differing from Example 1 were target composition, sputtering powers and $O_2$ flow rate. The halftone phase shift films thus obtained were examined for chemical resistance and dry etching behavior. The depositing conditions and test results are summarized in Table 1.

producing halftone phase shift mask blanks which meet both chemical resistance and dry etching rate.

Japanese Patent Application No. 2004-102288 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for the manufacture of a halftone phase shift mask blank comprising a transparent substrate and a translucent film of one or more layers having a controlled phase and transmittance, at least one layer of the translucent film comprising silicon, molybdenum and zirconium at the same time as constituent elements, said method comprising the steps of:
    disposing a target comprising at least two elements, zirconium and molybdenum in a molar ratio Zr/Mo between 0.05 and 5, and a silicon-base target in a common chamber, and
    inducing electric discharges to both the targets at the same time for sputtering, for thereby depositing the at least one layer of the translucent film having a molar ratio Zr/Mo of 0.05 to 5.

2. The method of claim 1, wherein the target comprising zirconium and molybdenum further comprises silicon.

3. A method for the manufacture of a halftone phase shift mask blank comprising a transparent substrate and a translucent film of one or more layers having a controlled phase and transmittance, at least one layer of the translucent film comprising silicon, molybdenum and zirconium at the same time as constituent elements, said method comprising the steps of:
    disposing a target comprising 80 to 99 mole % of silicon and 1 to 20 mole % of zirconium, and a molybdenum-base target comprising 80 to 100 mole % of molybdenum in a common chamber, and
    inducing electric discharges to both the targets at the same time for sputtering, for thereby depositing the at least one layer of the translucent film having a molar ratio Zr/Mo of 0.05 to 5.

4. A method for the manufacture of a halftone phase shift mask blank comprising a transparent substrate and a translucent film of one or more layers having a controlled phase and transmittance, at least one layer of the translucent film com-

TABLE 1

| Example | Target 1 Composition | Target 1 Sputtering power (W) | Target 2 Composition | Target 2 Sputtering power (W) | Si content (mol %) | Zr/Mo (mol ratio) | Dry etching time (sec) | Phase difference change (deg) |
|---|---|---|---|---|---|---|---|---|
| Example 1 | $Mo_5Zr$ | 50 | Si | 950 | 0.95 | 0.20 | 372 | 1.2 |
| Example 2 | $Mo_5ZrSi_{20}$ | 200 | Si | 800 | 0.954 | 0.20 | 370 | 1.4 |
| Example 3 | $Mo_5ZrSi_{160}$ | 1000 | — | — | 0.964 | 0.20 | 365 | 1.4 |
| Example 4 | $Mo_5ZrSi_{20}$ | 500 | Si | 500 | 0.885 | 0.20 | 375 | 1.6 |
| Example 5 | $ZrSi_9$ | 970 | Mo | 30 | 0.873 | 3.23 | 410 | 0.8 |
| Example 6 | $MoSi_9$ | 900 | Zr | 100 | 0.81 | 1.11 | 399 | 1.0 |
| Example 7 | $Mo_{20}Zr$ | 50 | Si | 950 | 0.95 | 0.05 | 363 | 2.1 |
| Comparative Example 1 | $MoSi_9$ | 1000 | — | — | 0.9 | — | 359 | 5.5 |
| Comparative Example 2 | $ZrSi_9$ | 1000 | — | — | 0.9 | — | 521 | 0.2 |
| Comparative Example 3 | $MoSi_9$ | 800 | Mo | 200 | 0.72 | — | 361 | 8.3 |

An overall evaluation of the test results reveals that the halftone phase shift films of Examples 1 to 7 meet both chemical resistance and dry etching rate. Of the halftone phase shift films of Comparative Examples 1 to 3, those films having good chemical resistance exhibit a low dry etching rate, and those films exhibiting a high dry etching rate have poor chemical resistance.

As is evident from the above, the film-depositing target and film-depositing method of the invention are fully effective for prising silicon, molybdenum and zirconium at the same time as constituent elements, said method comprising the steps of:

disposing a target comprising 80 to 98 mole % of silicon and 2 to 20 mole % of molybdenum, and a zirconium-base target in a common chamber, and inducing electric discharges to both the targets at the same time for sputtering, for thereby depositing the at least one layer of the translucent film having a molar ratio Zr/Mo of 0.05 to 5.

5. The method of claim 4, wherein the zirconium-base target comprises 80 to 100 mole % of zirconium.

* * * * *

UNITED STATES PATENT AND TRADEMARK OFFICE
CERTIFICATE OF CORRECTION

| | | |
|---|---|---|
| PATENT NO. | : 7,598,004 B2 | Page 1 of 1 |
| APPLICATION NO. | : 11/093297 | |
| DATED | : October 6, 2009 | |
| INVENTOR(S) | : Yoshikawa et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 722 days.

Signed and Sealed this

Twenty-eighth Day of September, 2010

David J. Kappos
*Director of the United States Patent and Trademark Office*